US006592676B1

(12) United States Patent
Mertens et al.

(10) Patent No.: US 6,592,676 B1
(45) Date of Patent: Jul. 15, 2003

(54) CHEMICAL SOLUTION AND METHOD FOR REDUCING THE METAL CONTAMINATION ON THE SURFACE OF A SEMICONDUCTOR SUBSTRATE

(75) Inventors: Paul Mertens, Haacht (BE); Lee Loewenstein, Plano, TX (US); Guy Vereecke, Chastre (BE)

(73) Assignees: Interuniversitair Micro-Elektronica Centrum, Leuven (BE); Texas Instruments, Inc., Dallas, TX (US)

( * ) Notice: Subject to any disclaimer, the term of this patent is extended or adjusted under 35 U.S.C. 154(b) by 0 days.

(21) Appl. No.: 09/467,528

(22) Filed: Dec. 20, 1999

Related U.S. Application Data
(60) Provisional application No. 60/131,309, filed on Apr. 27, 1999.

(30) Foreign Application Priority Data

| Jan. 8, 1999 | (EP) | 998700025 |
| Jan. 11, 1999 | (EP) | 998700033 |
| Mar. 24, 1999 | (EP) | 998700579 |

(51) Int. Cl.$^7$ .............................. B08B 7/04
(52) U.S. Cl. ..................... 134/2; 134/26; 134/29
(58) Field of Search .................... 134/2, 1.2, 1.3, 134/25.4, 26, 28, 29, 30, 902; 438/906; 510/108, 367, 375, 435

(56) References Cited

U.S. PATENT DOCUMENTS

| 5,158,100 A | * 10/1992 | Tanaka et al. ............... 134/105 |
| 5,290,361 A | 3/1994 | Hayashida et al. |
| 5,466,389 A | 11/1995 | Ilardi et al. |
| 5,560,857 A | * 10/1996 | Sakon et al. ................. 510/175 |
| 5,656,097 A | * 8/1997 | Olesen et al. .................. 134/1 |
| 5,845,660 A | * 12/1998 | Shindo et al. ............ 134/56 R |
| 5,846,335 A | * 12/1998 | Maekawa et al. .............. 134/6 |
| 5,846,921 A | * 12/1998 | Gil et al. ...................... 510/175 |
| 5,896,875 A | * 4/1999 | Yoneda .................... 134/102.3 |

FOREIGN PATENT DOCUMENTS

| DE | 19611 241 A1 | 9/1997 |
| EP | 0 528 053 A1 | 2/1993 |

(List continued on next page.)

OTHER PUBLICATIONS

Werner, Handbook of Semiconductor Wafer Cleaning Technology, 1993, Noyes Publication, pp. 19–20 and 97.*
Handbook of Semiconductor Cleaning Technology, Noyes Publications, pp. 19–21, 44–47, 121, 134–144. 1993.*

(List continued on next page.)

Primary Examiner—Alexander Markoff
(74) Attorney, Agent, or Firm—McDonnell Boehnen Hulbert & Berghoff

(57) ABSTRACT

The present invention is related to a method for reducing the metal contamination on a surface of a semiconductor substrate wherein said substrate is submitted to a wet cleaning or rinsing process in a solution capable of oxidising said surface and containing a substance strongly dissociating in said solution whereby creating an amount of ions of at least one species in said solution, at least one of the ion species being such that the ions of the species are binding to the oxidised surface in such a way that said amount of ions is substantially reducing the amount of metal ions bound to the oxidised surface.

Wet treatments such as rinsing, cleaning, in wet benches, batches and single wafer wet-cleaning equipment and single or double-side cleaning or etching applications can use the method of the present invention.

7 Claims, 2 Drawing Sheets

FOREIGN PATENT DOCUMENTS

| | | | |
|---|---|---|---|
| EP | 0 528 053 | | 2/1993 |
| EP | 0 560 324 | A1 | 9/1993 |
| EP | 0 560 324 | | 9/1993 |
| EP | 0 649 168 | A2 | 4/1995 |
| EP | 0 649 168 | A3 | 4/1995 |
| EP | 0 649 168 | | 4/1995 |
| EP | 0 678 571 | | 10/1995 |
| EP | 0 678 571 | A2 | 10/1995 |
| EP | 2 722 511 | | 10/1995 |
| FR | 2 722 511 | | 1/1996 |
| JP | 61-060799 | * | 3/1986 |

OTHER PUBLICATIONS

Christenson et al, Effects of SC–1 Dilution and Temperature Variations on Etch Rate and Surface Haze, MRSSP, vol. 386, pp. 135–141. 1995.*

Egawa, M., et al., "Effect of Surface Treatments After HF Etching on Oxidation of Si," *Japanese Journal of Applied Physics*, 33(2):943–949 (Feb. 1, 1994).

Hossain, S.D., "A Study of Heated SCI Solution for Selective Etching and Resist Particlulate Removal," *Extended Abstracts*, 93(1):1143 (Jan. 1, 1993).

*Understanding and Controlling the Chemistry of SCI Cleaning Solutions*, J.M. Rosamilia, T. Booone, J. Sapjeta, L. Psota–Klety, and K. Hanson, Lucent Technologies, 600 Mountain Avenue, Murray Hill, N.J., G.S. Higashi, Lucent Technologies, Orlando, Florida, pp. 209–212.

*Chemistry of the Silicon Oxide Surface: Metal Adsorption from SC1 Solutions*, Lindsey Hall, Jennifer Sees, Trace Hurd, Bud Schmidt and Laurel Bellay, Texas Instruments, Inc., Institute of Environmental Sciences and Technology, 1998 Proceedings, Contamination Control, $44^{th}$ Annual Technical Meeting, Phoenix, AZ Apr. 26–May 1, 1998, pp. 1–2.

*Effect of Surface Treatments after HF Etching on Oxidation of Si*, Masatoshi Egawa and Hideaki Ikoa, Faculty of Science and Technology, Science University of Tokyo, Noda, Chiba, 278, (Received Aug. 4, 1993, accepted for publication Dec. 18, 1993).

* cited by examiner

CHEMICAL SOLUTION AND METHOD FOR REDUCING THE METAL CONTAMINATION ON THE SURFACE OF A SEMICONDUCTOR SUBSTRATE

REFERENCE TO RELATED APPLICATIONS

This application claims priority benefits under 35 U.S.C. §119 to European Patent Application No. EP 998700025 filed on Jan. 8, 1999, to European Patent Application No. EP 998700033 filed on Jan. 11, 1999, to European Patent Application No. EP 998700579 filed on Mar. 24, 1999, and to U.S. Provisional Application Ser. No. 60/131,309 filed on Apr. 27, 1999. This application further incorporates by reference U.S. Provisional Application Ser. No. 60/131,309 filed on Apr. 27, 1999 in its entirety.

FIELD OF THE INVENTION

The present invention is related to a method for reducing the metal contamination on a surface of a semiconductor substrate which is submitted to a wet cleaning process.

BACKGROUND OF THE INVENTION

One of the challenges in semiconductor device processing is the problem of metal contamination on the semiconductor surface. Semiconductor devices are extremely sensitive to minute quantities of metals adsorbed to the semiconductor surface. These metallic species are well known to deteriorate electrical performance. Particularly, Group IIA metals have been found to be very detrimental to the gate oxide layers. There is an important need to reduce metallic contamination to low levels.

The RCA cleaning sequence which is still standard in semiconductor (silicon wafer) device processing was devised in the years 1970s. The SC1 or Standard Clean 1 process, using a mixture of concentrated $NH_3$ and $H_2O_2$ mixed with $H_2O$ in a ratio of 1:1:5, is used largely to remove particulates. The SC2 or Standard Clean 2 process, using a mixture of HCl, $H_2O_2$ and $H_2O$, is used to remove metallic contaminants from the silicon surface. These SC1 and SC2 cleaning steps, in either order are each followed by a rinsing step in DI water, whose purpose is to remove acidic or caustic species from the wafer and to remove metallic contaminants remaining in solution near the wafer surface from proximity with the wafer.

Current cleaning and rinsing techniques have proven to be unsuccessful at reducing metallic contaminants to the low levels required without significantly increasing at great the cost of the DI rinse water supply purity. The final rinse of the cleaning process contributes to metal contamination, even in ultra pure water (UPW), and must be improved. The microelectronics industry also needs to lower its costs. In cleaning, this can be done through the introduction of simplified cleaning recipes, including a single chemistry clean that has both good particle and metal performance. Ammonia-peroxide-water mixtures (APM) today have good particle performance, but their performance with respect to metallic contamination needs much improvement.

It was shown by Hall and co-workers (Hall et al., IEST 1998 Proceedings, the ICCCS 14$^{th}$ Int. Symp. On Contamination Control, Apr. 26–May 1, 1998) that calcium contamination and contamination by other metals is worse for dilute SC1 chemistries, where the concentrated chemicals $NH_3$, $H_2O_2$ and $H_2O$ are mixed in a ratio of 1:1:30, than for SC1 solution, where the concentrated chemicals $NH_3$, $H_2O_2$ and $H_2O$ are mixed in a ratio of 1:1:5. Hall's explanation for the reduced adsorption of Ca and other metal ions is that they form amine complexes, that is $M(NH_3)_n^+$, where n typically is between 1 and 6.

The Applicants have previously suggested that $H^+$ always is present in the environment of the silicon wafer so that metals do not attach to the silicon substrate (see EP-96309145.9 incorporated herein by reference). This is indeed a possible solution to the recontamination problem, but it is not applicable in all circumstances. Notably, it is not possible to keep the wafer environment always acidic during a rinse or during APM or SC1 treatment. Coming out of an SC1 process or a similar process, wafers would go through various levels of alkaline solution, and then pass through neutrality, before reaching an acid rinse condition, even if an acidic rinse is carried out.

U.S. Pat. No. 5,290,367 discloses a surface cleaning solution for use in semiconductor processing, said solution containing as a complexing agent a compound having one or more phosphoric acid groups or a salt thereof and a polyphosphoric acid or a salt thereof. The complexing agent is binding to metals and therefore reduces the adsorption of metals to the semiconductor surfaces.

U.S. Pat. No. 5,466,389 discloses an alkaline cleaning solution for use in semiconductor IC processing. The invention is aimed to avoid the presence of unstable compounds such as $H_2O_2$ in cleaning solutions used for semiconductor processing. The invention furthermore aims to achieve semiconductor wafer cleaning with such cleaning solutions without causing undue wafer roughness.

The compound $N(CH_3)_4OH$ is known to be a possible alternative for $NH_4OH$ in SC1 solutions. $N(CH_3)_4OH$ (TMAH) is strongly dissociating in aqueous environments.

Other prior art patents disclosing methods for reducing the adherence of metallic impurities to semiconductor surfaces include EP649168 and EP528053. The solutions as disclosed in these patents are successful in reducing the contamination level of only a limited number of metal ions. The addition of phosphonic acid to the cleaning solution disclosed in EP528053 can introduce undesired organic residue on the substrates and the phospor element may lead to an undesired doping of the semiconductor substrate. EP649168 furthermore is limited to acid solutions having a pH of lower than about 5.

AIMS OF THE INVENTION

The present invention includes a method for enhancing the metal removal capability of a semiconductor substrate in a substrate cleaning process, without requiring greatly increased chemical purities.

By "enhancing the metal removal capability", it is to be understood for the purpose of the present patent application, reducing surface concentrations on the surface i.e. removing the metal contaminants from the surface of the semiconductor substrate and/or preventing the adsorption of metal contaminants present in the chemical solution onto said surface.

The present invention therefore aims to enable a cost-effective single chemistry cleaning.

SUMMARY OF THE INVENTION

The present invention is related to a method for reducing the metal contamination on a surface of a semiconductor substrate wherein said substrate is submitted to a wet cleaning process in a solution capable of oxidising said surface and containing a substance for substantially reducing the amount of metal ions bound to the oxidised surface.

In a first aspect of the present invention, a method for reducing the metal contamination on a surface of a semiconductor substrate is disclosed. According to the method of the invention, said substrate is submitted to a wet cleaning and/or rinsing process in a solution capable of oxidising said surface and containing a substance strongly ionising in said solution whereby creating an amount of ions of at least one species in said solution. At least one of the ion species is having such size and shape that the ions of this species are binding strongly to the oxidised surface and said amount of ions is sufficient to substantially reduce the amount of metal ions bound to the oxidised surface.

The substance is strongly ionising in said solution whereby creating an amount of ions of at least one species in said solution. Thus the substance is dissociating, or possibly hydrolysing, into ions. The ions preferably are plurality $NH_4^+$ ions and/or derivates and/or compounds thereof that have the beneficial impact on reducing the amount of metal ions bound to the oxidised surface. With the term strongly ionising, it is meant that at least about 6% of the molecules of the substance is dissociating into ions. Under the term strongly ionising, it is also understood that about 7 to 8 or 9–10–15–20–30–40–50–60–70–80–90–100% of the molecules of the substance are dissociating into ions. These numbers of strong ionisation are given for room temperature conditions, equivalent numbers being relevant for higher or lower temperature conditions of practising the invention. The invention can be practised at temperatures lower (above 0° C.) or higher (for instance 50 or 60 or 80 or 100° C. or higher) than room temperature. The invention can further be practised at ambient temperature.

Preferably the solution is at a pH value of about 5 or at a pH value of about 5.5 or 6 or 6.5 or 7 or higher. Preferably also said solution does not contain in combination a non-ionic surfactant and an effective amount of a pH reducing chemical component to reduce or control the pH of the solution to a pH within the range of from about pH 8 to about pH 10. The combination of chemical components in the solution in the latter combination would lead to a competing mechanism of surfactants absorbing on the surface of the substrate. The teaching of the patents U.S. Pat. No. 5,466, 389 and EP0678571 are both incorporated herein by reference in their entirety in order to illustrate the effect of the latter combination of components.

In a preferred embodiment of the invention, the amount of ions of the species is present in such concentration that the concentration of said metal ions on said surface is reduced to below $10^{12}$ or $10^{11}$ or even $10^{10}$ atoms/cm$^2$. At least one of the ion species is such that the ions of the species are binding to the oxidised surface in such a way that said amount of ions is substantially reducing the amount of metal ions bound to the oxidised surface. Thus the ions of this species have such size and shape that the ions (in the specification also referred to as cations or benign cations) are binding strongly to the oxidised surface and can remove metal ions bound to the oxidised wafer surface. The property of one cation's ability to suppress the adsorption of metal ions is part of the invention. Under all circumstances, whether in acidic, alkaline or neutral solution, metal ion adsorption to the wafer surface is reduced by the addition of cations to the cleaning solution. In acidic solution, H$^+$ may be sufficient to reduce metal adsorption, but the addition of cations such as $NH_4^+$ or other cations can significantly suppress metal adsorption.

Said substance can be present in a concentration larger than about $10^{-5}$ or $10^{-4}$ or $10^{-2}$ mol/l.

Said solution preferably comprises ammonia. Said solution can further comprise ammonia, hydrogen peroxide and water in a relation of about 1:1:5. It is to be understood for the purpose of this application that "hydrogen peroxide" referred to in the :: signs is a solution of about 28% of $H_2O_2$ in $H_2O$. It is to be understood for the purpose of this application that "ammonia" referred to in the :: signs is a solution of about 30% of ammonia in $H_2O$.

Said solution can also comprise a mixture of ammonia, hydrogen peroxide and an alcohol. The alcohol may be selected from the group consisting of isopropanol, ethanol and mixtures of isopropanol and ethanol.

In an embodiment of the first aspect of the invention, the method can comprise the steps of:

preparing said solution capable of chemically oxidising said surface and containing said substance; and thereafter immersing said substrate in said solution while maintaining processing conditions such that said substance is substantially reducing metal ions of binding to the oxidised surface.

The method can also comprise the steps of:

exposing said surface to an aqueous solution containing an oxidising agent and a base agent while maintaining processing conditions such that a chemical oxide is formed on said surface; and adding to said solution said substance capable of binding to the oxidised surface while maintaining processing conditions such that said substance is substantially reducing the amount of metal ions bound to the oxidised surface.

Said solution preferably has a pH of about 7, a pH of 7.5 or a pH of 8 or of 9 or even higher (e.g. of 10).

According to second aspect of the present invention, a chemical solution for use in semiconductor device processing is disclosed, said solution consisting essentially of water, an oxidising agent, a base agent and a salt of ammonium.

A third aspect of the invention is to disclose the use of a chemical solution comprising water, an oxidising agent, a base agent and a salt of ammonium for cleaning and/or rinsing of semiconductor substrates, the amount of the salt of ammonium in said solution being such that the presence of metallic contaminants on the substrates is reduced.

According to another aspect of the present invention, a chemical solution for use in semiconductor device processing is provided. The solution consists essentially of water, an oxidising agent, a base agent and a salt of ammonium. In one embodiment, the salt in the solution is selected from the group consisting of $NH_4F$, $NH_4Cl$, $NH_4Br$, $NH_4I$, $NH_4NO_3$, and $(NH_4)_2SO_4$.

According to still another aspect of the present invention, a chemical solution for use in semiconductor device processing is provided. The solution consists essentially of an alcohol, an oxidising agent, a base agent and a salt of ammonium, the alcohol selected from the group consisting of isopropanol, ethanol, and mixtures of ethanol and isopropanol. In one embodiment, the salt in the solution is selected from the group consisting of $NH_4F$, $NH_4Cl$, $NH_4Br$, $NH_4I$, $NH_4NO_3$, and $(NH_4)_2SO_4$.

Yet another aspect of the invention is to disclose a method of using a chemical solution with semiconductor substrates. The chemical solution comprises a liquid, an oxidising agent, a base agent and a salt of ammonium for cleaning and/or rinsing of semiconductor substrates, the liquid being selected from the group consisting of water, isopropanol, ethanol, and mixtures of ethanol and isopropanol, the amount of the salt of ammonium in said solution being such that the presence of metallic contaminants on the substrates is reduced.

Still another aspect of the invention is to disclose a method of producing a chemical solution for use in a cleaning and/or rinsing step of semiconductor device processing. The solution comprises a liquid and an oxidising agent, the liquid being selected from the group consisting of water, isopropanol, ethanol, and mixtures of ethanol and isopropanol, the method comprising the step of admixing an acid agent and a base agent in said solution while at least one semiconductor substrate is cleaned in said solution.

Yet another aspect of the invention is a method of producing a chemical solution for use in a cleaning step of semiconductor device processing. The solution comprises a liquid and an oxidising agent, the liquid being selected from the group consisting of water, isopropanol, ethanol, and mixtures of ethanol and isopropanol, the method comprising the step of admixing an acid agent and a base agent in said solution prior to exposing one semiconductor substrate to said solution. The acid agent, in one embodiment, is selected from the group consisting of HCl, HBr and $HNO_3$ and said base agent is $NH_3$.

In the different aspects of said semiconductor substrate is one of a batch of wafers being simultaneously processed in a single tank, tanks, or wet bench or a single wafer in a single wafer cleaning tool.

DETAILED DESCRIPTION OF A SPECIFIC EMBODIMENT OF THE PRESENT INVENTION

Figure 1:
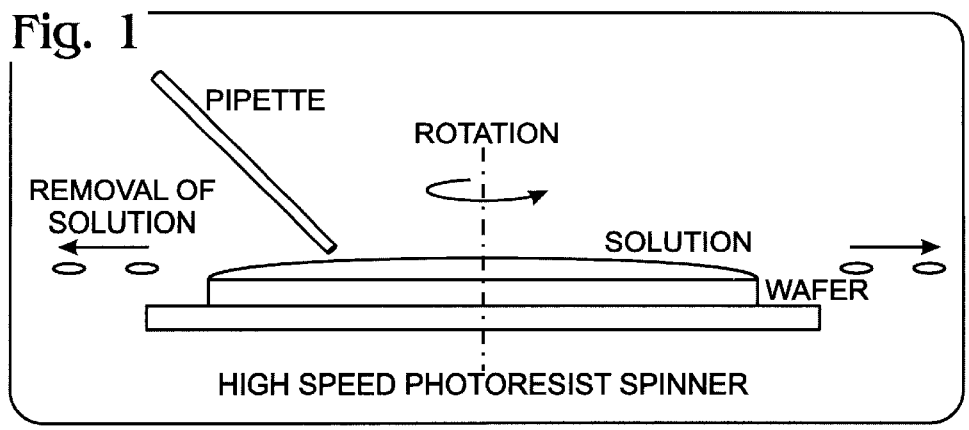
FIG. 1 represents a schematic view of the surface treatment of silicon wafer on a high-speed spinner.

The mechanisms of acidic treatment to remove metallic contaminants from the silicon surface are not completely understood so far.

Studies lack a comprehensive model relating the concentrations of adsorbing species in solution to the resulting metal concentrations on the wafer surface. While it is known that materials in solution somehow end up on the silicon surface, the relationship between solution and surface concentration is not known.

Thermodynamics teaches that $SiO_2$ rather than Si is the stable form of Si in the Si—$H_2O$ system. Kinetics limit the thermodynamically favourable transformation to a thin surface layer of oxide. Wherever $SiO_2$ and water coexist, one can also expect the formation of Si—OH groups. The acid-base behaviour of Si—OH groups on a hydrophilic silicon wafer surface resulting from wafer cleaning is of importance. The behaviour of the oxidised surface is similar to that of silica gel, whose Si—OH groups act as weakly acidic ion exchangers. The surface Si—OH groups, SiOH(s), can dissociate in water, as in Equation (1) mentioned hereunder. Likewise, metal cations can attach to and dissociate from surface groups, SiO$^-$(s) and SiOM(s), as in Equation (2) mentioned hereunder.

$$SiOH(s) \rightarrow SiO^-(s) + H^+(aq) \qquad (1)$$

$$SiOM(s) \rightarrow SiO^-(s) + M^+(aq) \qquad (2)$$

Application of standard equilibrium expressions yields a relation between concentrations.

$$\sigma_{SiOM} = K\sigma_{SiOH}\frac{[M^+]}{[H^+]} \qquad (3)$$

where $[H^+]$ and $[M^+]$ are volume concentrations of the hydrogen ion and a generic metal cation, and $\sigma_{SiOM}$ and $\sigma_{SiOH}$ are surface concentrations.

Acids are known from chemistry to enhance the dissolution of many metal species, and thus their action on the silicon surface was not questioned deeply. It was shown, however, that the silicon surface acts very similarly to a silica gel surface. Silica gel consists of a loosely formed matrix of silicon dioxide. Its surface contains hydroxyl groups in different arrangements, which serve as ion exchange sites for metal ion attachment.

While Equations (1), (2) and (3) provide a good starting point for understanding the equilibrium between metal cations in aqueous solution and metal cations adsorbed to a hydrophilic surface, these equations are still inadequate. These equations can explain the ability of $H^+$ to remove metal attached to the hydrophilic silicon surface, which is covered by a chemical oxide. By Le Chatelier's Principle, addition of species present on the right side of Equation (1)—that is, $H^+$—will force the reaction to the left. Thus SC2, which operates in an acidic medium, results in metal removal.

The equations moreover indicate one of the problems of current cleaning techniques, since the RCA sequence includes a rinsing step in DI water. During the rinsing step(s) the pH is brought to nearly 7, since DI water is neutral, and will have a pH of 7 if there is no $CO_2$ or an acid dissolved in it. If $CO_2$ is dissolved in the water, the pH will be about 5.6. As the pH is increased, or the $H^+$ content of the water around the wafers is reduced, the wafers will again be in an environment where metals in solution, even at the relatively low concentrations in high purity DI water, will tend to readsorb on the wafer surface.

The present invention aims to enable a cost-effective single chemistry cleaning and/or rinsing process and solution. The invention is supported by the model analysis of the experiments described hereinbelow. The experiments are the best mode practice at the moment of filing of the invention. The present invention allows to define a working mode for ionic metal adsorption on oxidised wafer surfaces for a wide range of solutions. It proves that ultra low metal contamination levels can be obtained by tying the surface sites up with benign cations like $H^+$ and $NH_4^+$. Benign cations have such size and shape that the ions of this species (the cations) are binding strongly to the oxidised surface. The model deduced from the invention also enables the engineering of the level of acid spiking that is needed to obtain good final rinsing accounting also for the UPW purity.

The property of one cation's ability to suppress the adsorption of other cations is part of the invention. Under all circumstances, whether in acidic, alkaline or neutral solution, metal ion adsorption to the wafer surface will be reduced by the addition of cations to the cleaning solution. In acidic solution, $H^+$ may be sufficient to reduce metal adsorption, but the addition of $NH_4^+$ or other cations can significantly suppress metal adsorption and can be used where $H^+$ can not.

In a first aspect of the present invention, a method for reducing the metal contamination on a surface of semiconductor substrate is suggested. In this method, said substrate is submitted to a wet cleaning process in a solution capable of oxidising said surface and containing a substance strongly ionising in said solution whereby creating an amount of ions of at least one species in said solution. At least one of the ion species is having such size and shape that the ions of this species are binding to the oxidised surface and said amount of ions is sufficient to substantially reduce the amount of metal ions bound to the oxidised surface. Preferably, the amount of ions of the species is present in such concentration that the concentration of said metal ions on said surface is reduced to below $10^{10}$ atoms/cm$^2$.

Said ions of the species (cations) may be added as salts of chloride or nitrate, for example. Thus $NH_4Cl$ (ammonium chloride) and $NH_4NO_3$ (ammonium nitrate) are possible substances (additives) to be added to the cleaning solution for the suppression of metal adsorption. The $Cl^-$ and $NO_3^-$ generally do not form insoluble combinations with metal ions in aqueous solution. It is to be noted that $NH_4Cl$, $NH_4NO_3$ and related compounds can be produced by the neutralisation of $NH_3$ with HCl, $HNO_3$, etc.

$$NH_3+HCl \rightarrow NH_4^+(aq)+Cl^-(aq) \tag{4}$$

This may be the preferred way of creating said compounds due to the high purity of electronic grade $NH_3$ and HCl and $HNO_3$ which are readily available.

Residual $NH_4Cl$ and $NH_4NO_3$ on the wafer surface is either innocuous or will sublime during a subsequent heat treatment.

In embodiment of the first aspect of the invention, a best mode practice is described by way of disclosing experiments with Si wafers. The teaching of the other aspects of the invention can be deduced by the person of skill in the art from these different experiments.

Si (100) wafers of 150 mm diameter are prepared and receive a standard IMEC-CLEAN® process. This IMEC-CLEAN® process consists of sequential treatment in $H_2SO_4/O_3$, and dilute HF, ending with a dilute $HCl/O_3$ rinse and possibly a Marangoni dry, leaving the wafer surface hydrophilic.

More precisely, three experiments are described. The first delineates the role of $NH_4^+$ ions in preventing metal ion adsorption from neutral aqueous solution. The second demonstrates the low metal adsorption of metal ions from APM solution, which is interpreted in terms of competitive adsorption in the presence of $NH_4^+$ ions. The third experiment shows the effect of increasing $NH_4^+$ concentrations. The ions of the species (the $NH_4^+$ cations) that reduce the metal adsorption on the wafer surfaces, are also from a substance that is added as a salt $NH_4Cl$.

The controlled contamination technique in which wafers are exposed to prepared solutions of metal ions is common to the experiments. Calcium comes from solid $Ca(NO_3)_2 \cdot 4H_2O$ (Merck, Suprapur® grade: maximum 50 ppm barium and strontium, less for other metals). After exposure to the treating solution, the wafers are spun for 30 sec on a high-speed wafer spinner to rapidly remove the solution from the wafer surface and dry the wafers. No other rinse or drying procedure is used. The procedure is illustrated in FIG. 1. The contaminant surface concentrations are measured by total x-ray fluorescence (TXRF) with the Atomika Model XSA 8010 spectrometer, first pre-concentrating the metals using vapour-phase decomposition/droplet collection (VDP/DC), and then drying the droplets with a heat lamp.

The first experiment is described herebelow.

The controlled contamination technique in which wafers are exposed to prepared solutions of metal ions is common to the experiments and is described hereabove.

The effects of $NH_4^+$ on $Ca^{2+}$ adsorption in this first experiment are explored using a quadratic design developed using the experimental design software package, ECHIP. There are 11 distinct trial conditions to which three checkpoints are added (Trials 101–103). Three to four replicates are performed for each design point, and two replicates for each checkpoint. To reduce the time needed to perform the experiment, trials replicates are performed one after another. $NH_4Cl$ from Merck (Suprapur® grade: maximum 0.5 ppm calcium, 5 ppm barium and potassium, less for other metals) is added in different concentrations to the treating solution in the different conditions.

The experiments are evaluated as follows. Knowing that $H^+$ can prevent metal ion adsorption onto wet chemical oxide, the acidity of ammonium is considered. The conjugate acid of the base, ammonia, is the ammonium ion, $NH_4^+$. Ammonia is a weak base, reacting according to the following formulas:

$$NH_3+H_2O=NH_4^++OH^- \tag{5}$$

The corresponding equilibrium expression is

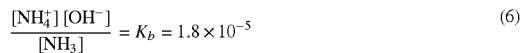

$$\frac{[NH_4^+][OH^-]}{[NH_3]} = K_b = 1.8 \times 10^{-5} \tag{6}$$

Salts such as $NH_4Cl$ act as weak acids according to:

$$NH_4^{3o}+H_2O=H_3O^++NH_3 \tag{7}$$

The hydrolysis constant, $K_h$, is given by

$$\frac{[H_3O^+][NH_3]}{[NH_4^+]} = K_h \tag{8}$$

$K_h$ and $K_b$ are related by

$$K_h = \frac{K_w}{K_b} = 5.6 \times 10^{-10} \tag{9}$$

where $K_w$ is the equilibrium constant

$$[H_3O^+][OH^-]=K_w=1.0\times10^{-14} \tag{10}$$

governing the dissociation of water:

$$2H_2O=H_3O^++OH^- \tag{11}$$

Figure 2:
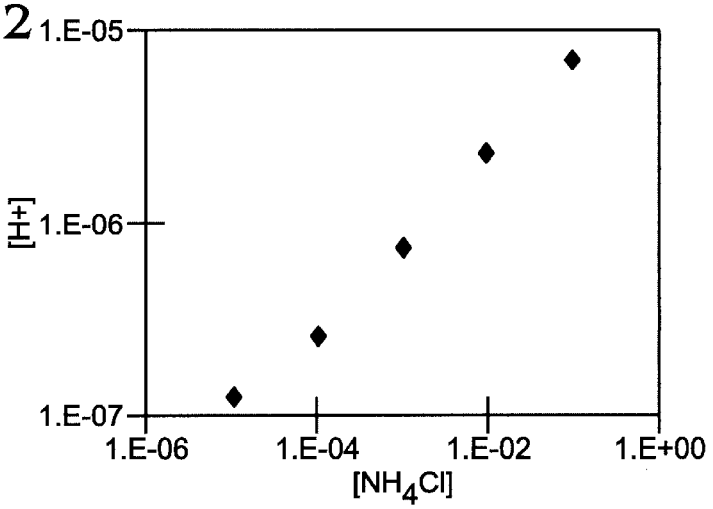
FIG. 2 represents the dependence of $[H^+]$ on added $NH_4Cl$ in water at room temperature.

When ammonium chloride is dissolved in water, very little of the ammonium dissociates, so that $[H_3O^+]$ is only slightly elevated, as shown in FIG. 2. At an added concentration of the substance of $10^{-2}$ mol/l of $NH_4Cl$ (the highest in this experiment) $[H^+]$ is still only $2\times10^{-6}$ mol/l, a concentration which is known to have minimal effect on the surface concentration of adsorbed metal ions.

The second experiment is described herebelow.

In order to determine $Ca^{2+}$ adsorption from SC1 and acid solution, $Ca^{2+}$ adsorption onto a chemical oxide from intentionally contaminated SC1 solution is compared to $Ca^{2+}$ adsorption from nitric acid solution at pH 3, 4.5 and 5.7. SC1 solution is prepared as 1:1:5 $NH_3:H_2O_2:H_2O$ using semiconductor-grade purity chemicals. In trials under acid conditions, $HNO_3$ is used. Solutions are prepared at room temperature. It is to be understood for the purpose of this application that "$H_2O_2$" referred to in the proportionality (:) signs is a solution of about 28% of $H_2O_2$ in $H_2O$. It is to be understood for the purpose of this application that '$NH_3$' referred to in the :: signs is a solution of about 30% of ammonia in $H_2O$.

Figure 3:
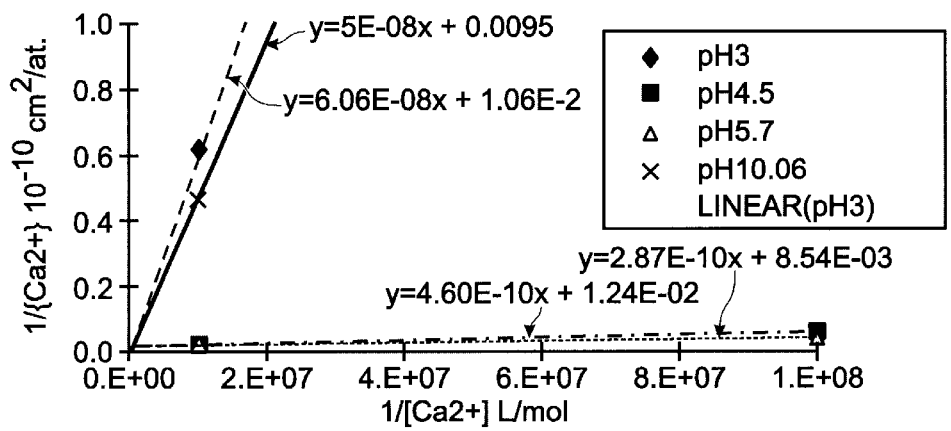
FIG. 3 describes the adsorption of $Ca^{2+}$ onto a chemical oxide Si surface in a SC1 solution, as measured by TXRF following concentration by VPD-DC. $\{Ca^{2+}\}$ is a surface concentration (at./cm$^2$), and $[Ca^{2+}]$ is a solution concentration (mol/L).

Calcium adsorption from an SC1 solution is measured in this second experiment (see FIG. 3). It was observed that calcium contamination from such a solution is greatly reduced compared to a neutral solution.

Calcium contamination at an SC1 solution of pH 10 is in fact comparable to that in an acidic solution of pH 3. To interpret FIG. 3, note that high surface concentrations are at the bottom of the plot, and high solution concentrations are at the left of the plot. The acidic conditions show behaviour expected according to the modified Langmuir theory of competitive adsorption. The results are plotted as the inverse surface concentration, $1/\sigma_{Ca}$ or $1/\{Ca\}$, against the inverse of the solution concentration, $1/[Ca^{2+}]$. The slopes and intercepts of the inverse concentration-Ca adsorption curves in FIG. 3 for different pHs are shown in Table 1 below. Adsorption follows the following behaviour:

$$\frac{1}{\sigma_{Ca}} = \frac{1}{\sigma_0} + \frac{1 + K_H[H^+]}{\sigma_0 K_{Ca}[Ca^{2+}]} \quad (12)$$

where $\sigma_0$ is the surface adsorption site density, $K_{Ca}$ is the $Ca^{2+}$ adsorption equilibrium constant, and $K_H$ is the $H^+$ adsorption equilibrium constant. The plot yields straight lines with intercept $1/\sigma_0$ so and slope $(1+K_H[H^+])/\sigma_0 K_{Ca}$. By studying the calcium adsorption at several pHs, one can calculate $K_H$, $K_{Ca}$ as well as $\sigma_0$. FIG. 3 supports this interpretation of metal adsorption, since for all pH<7, the slope decreases with [H+], and all of the lines have statistically equal intercepts. Since the SC1 process provides an adsorption curve with the same intercept, the metal adsorption mechanism in SC1 is effectively the same as in the acid solutions. Since there is very little $H^+$ present—the pH is 10, so [H+] is $10^{-10}$ mol/L—there must be a different cation causing the suppression of $Ca^{2+}$ adsorption for SC1.

As stated above, it was shown by Hall and co-workers (Hall et al., IEST 1998 Proceedings, the ICCCS 14$^{th}$ Int. Symp. On Contamination Control, Apr. 26–May 1, 1998) that calcium contamination and contamination by other metals is worse for dilute SC1 chemistries, where the chemicals $NH_3$, $H_2O_2$ and $H_2O$ are mixed in a ratio of 1:1:30, than for standard SC1 solution, where the chemicals $NH_3$, $H_2O_2$ and $H_2O$ are mixed in a ratio of 1:1:5. Hall's explanation for the reduced adsorption of calcium and other metal ions is that they form amine complexes, that is $M(NH_3)_n^+$, where n typically is between 1 and 6. It is known however that $Cu^{2+}$ does form amine complexes, whereas $Ca^{2+}$ and many other metal ions do not form amine complexes. Consequently, this interpretation by Hall of the reduced metal adsorption in SC1 is wrong.

Explanation comes rather from a larger view of the interaction of solutes and the semiconductor surface. Specifically, $H^+$ does not occupy a special position when it comes to attachment to the >SiO$^-$ group. Equation (13) can take place:

>SiOM$_1$+M$_2^+$⇔>SiOM$_2$+M$_1^+$  (13)

Thus, one metal ion can displace another metal ion from the surface, as well as $H^+$. The critical feature, however, is not that $M_1$ and $M_2$ are metal ions, but rather that they are cations, that is, positively charged ions. As cations, they can attach to the >SiO$^-$ group.

By adding a cation, $M_2^+$, to the system containing the wafer, we can displace $M_1$ from the surface. This is not appealing if one is substituting one yield killer in the production process of semiconductor devices for another. Indeed, different metal ions have different propensities for causing electrical degradation. In addition, while most cations that are dealt with derive from metals, some do not. A good example for a cation is the ammonium ion, $NH_4^+$, and its derivatives, $R_nNH_{4-n}^+$, where R is typically an organic group such as $CH_3$, and n=0–4. Naturally, mixed organic groups may also be used, as in $R_mR'_nNH_{4-m-n}^+$. In the SC1, the active species is $NH_4^+$, not $NH_3$. At pH 3, there are $10^{-3}$ mol/L of cations, namely $H^+$. At pH 10, there is $10^{-4}$ mol/L of $NH_4^+$, so one gets metal contamination suppression from $NH_4^+$, the cation now dominating the solution.

The present invention allows to suggest a model for ionic metal adsorption on oxidised wafer surfaces for a wide range of solutions. It proves that ultra low metal contamination levels can be obtained by tying the surface sites up with benign cations like $H^+$ and $NH_4^+$. The model enables the engineering of the level of acid spiking that is needed to obtain good final rinsing accounting also for the UPW purity. Ionic metal adsorption from APM is strongly reduced by increasing the concentration of $NH_4^+$ in the solution.

The third experiment is described herebelow.

Figure 4:
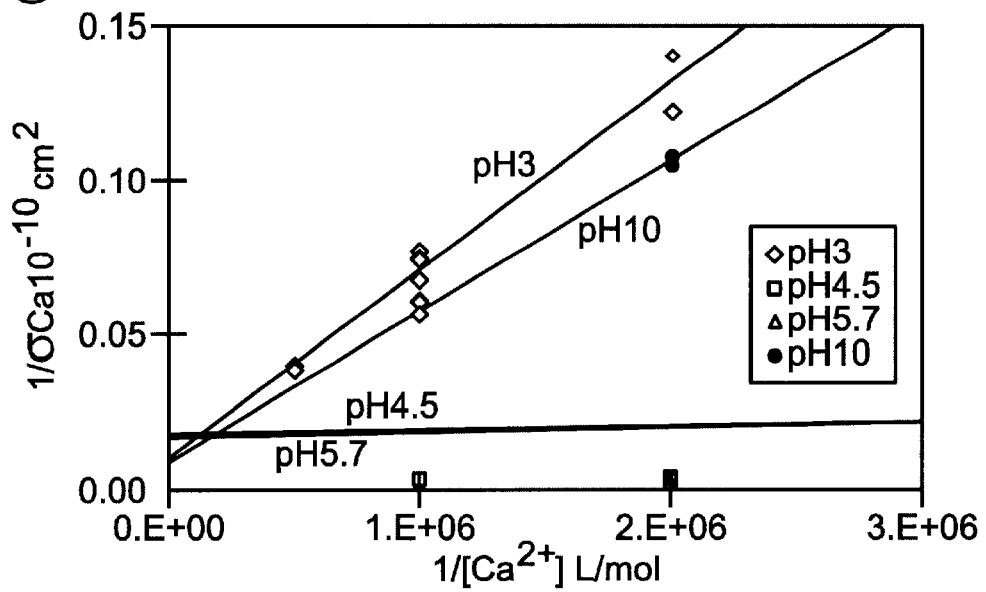
FIG. 4 is representing the dependence of $1/\sigma_{Ca}$ on $1/[Ca^{2+}]$ at pH 3, 4.5, 5.7 and 10.6 in an AP solution.

The behaviour of metallic adsorption in 1:1:5 $NH_3$:$H_2O_2$:$H_2O$ APM is investigated. Consider Ca contamination in APM, shown in FIG. 4. The amount of calcium contamination from APM is comparable to contamination from an acidic solution of pH 3. While there is contamination by some metals in APM (e.g. aluminium and iron), severe metallic contamination is not a general problem. One suggested reason has been that $NH_3$ complexes metal ions in solution. While valid for metals like copper, which form strong amine complexes, this explanation can not be used for metals like calcium that do not form such complexes. FIG. 4 shows that Ca adsorption from APM behaves similarly to its adsorption from acidic solution, i.e. its dependence on [$M^+$] is described by an expression similar to (3). In APM, the cation, $NH_4^+$, acts equivalently to $H^+$ in acid solutions.

Figure 5:
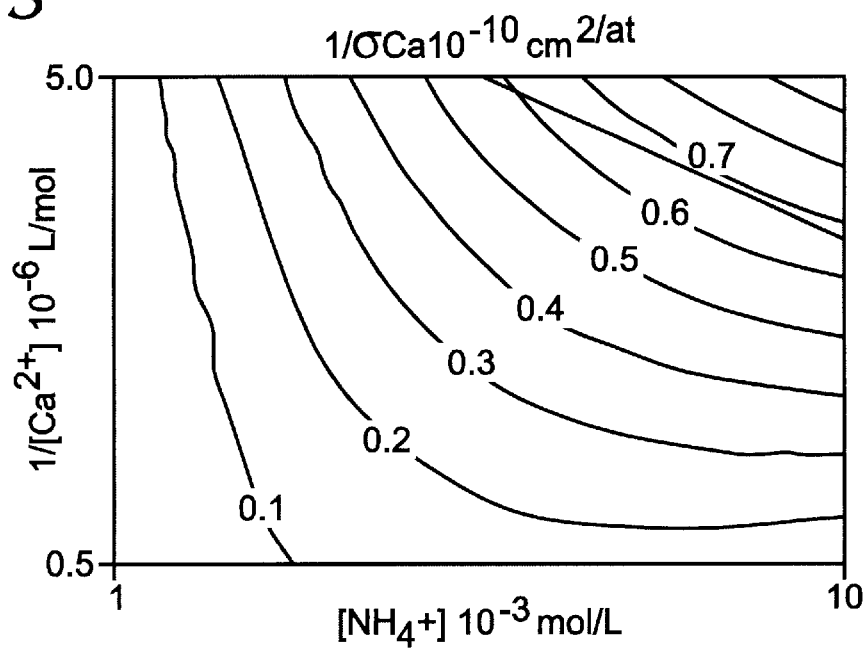
FIG. 5 is representing the contour plot of $1/\sigma_{Ca}$ as a function of $[NH_4^+]$ and $1/[Ca^{2+}]$. Contours intervals are $0.1 \times 10^{-10}$ cm$^2$ in a APM solution.

The role of $NH_4^+$ by examining surface contamination from solutions containing Ca(NO$_3$)$_2$ and $NH_4$Cl is confirmed. FIG. 5 shows that increasing [$NH_4^+$] does indeed drastically reduce the metal surface adsorption. APM and dilute APM processes can thus be improved with regard to ionic metal adsorption by adding $NH_4^+$ according to the principle of competitive adsorption.

The property of one cation's ability to suppress the adsorption of other cations is part of the invention. Under all circumstances, whether in acidic, alkaline or neutral solution, metal ion adsorption to the wafer surface will be reduced by the addition of cations to the cleaning solution. In acidic solution, $H^+$ may be sufficient to reduce metal adsorption, but the addition of $NH_4^+$ or other cations can significantly suppress metal adsorption.

In alkaline solution such as SC1, addition of $NH_4^+$ will also repress metal adsorption. This is not equivalent to adding more $NH_3$. When adding more $NH_3$, the amount of $NH_4^+$ is controlled by the reactions

$NH_3+H_2O⇔NH_4^++OH^-$ (15)

and

$H_2O⇔H^++OH^-$ (16)

In such a case, the amount of cations will only rise at approximately [$NH_3$]$^{1/2}$. Addition of $NH_4^+$ entails the addition of a counter ion such as Cl⁻. In order to maintain charge neutrality, the following equation must be satisfied:

$$[H^+]+[NH_4^+]=[OH^-]+[Cl^-] \quad (17)$$

where the bracketed terms represent molar concentrations in solution. The sum of cations must remain as large as the amount of added Cl⁻, since Cl⁻ is the anion of a strong acid, HCl, and thus cannot be charge-neutralised. The same statement applies to $NO_3^-$ and the anions of other strong acids such as Br⁻ and I⁻.

Lower chemical consumption that can be achieved by going to a dilute SC1 chemistry must be balanced against potentially worsened metal contamination. $NH_4Cl$ can be added to increase the $NH_4^+$ content of the bath, but this means that almost as much $NH_4Cl$ has to be added as $NH_3$ was left out, so chemical gains are limited primarily to lower use of $H_2O_2$. This is illustrated in Table 2.

In conclusion, it is shown that the ammonium ion, $NH_4^+$, prevents $Ca^{2+}$ adsorption onto wet chemical oxide. The equilibrium constant, $K_{NH4}$, describing the adsorption of $NH_4^+$ is about on the order of $10^3$ L/mol or 5000 L/mol, comparable to or larger than the adsorption equilibrium constant of H⁺, meaning that $NH_4^+$ is as good or better than H⁺ in removing metals from the silicon surface and in keeping metals off the surface. In SC1 solution (1:1:5 $NH_3:H_2O_2:H_2O$) at room temperature, the relatively low $Ca^{2+}$ adsorption on the wet chemical oxide of Si can be explained by competition for adsorption sites with $NH_4^+$, which is the dominant cation in SC1 solution. The model also helps to explain the metal contamination behaviour that has been observed by others in SC1 solutions. Furthermore, understanding the role of $NH_4^+$ allows to form greatly improved dilute SC1 process recipes, with full SC1 process capability and reduced chemical consumption.

In pH-neutral solution such as in a rinse, adding $NH_4Cl$, or other appropriate chemicals in line with our present discussion, to the ultrapure water will greatly reduce metal adsorption. The chemicals added to the rinse solution may be coordinated with those of the prior treatment as acid or base is rinsed away.

The above treatment was described largely for aqueous systems; however, acid-base behaviour is supported in non-aqueous systems such as ethanol and/or isopropanol. Consequently, the same treatments can be applied in non-aqueous environments. Furthermore, both H⁺ and cations are members of a larger group, known as Lewis acids, which should exhibit behaviour analogous to Equation (5), and thus these substances are also to be considered as covered elements of the invention. Furthermore, non-silicon semiconductors as well as other materials will follow the basic principles of Equation (5), and these thus are also covered elements of the invention too. Also other embodiments of the invention can be imagined by the person skilled in the art, the spirit and scope of the invention being limited only by the terms of the appended claims.

TABLE 1

Slopes and intercepts of the inverse concentration-Ca adsorption curves in FIG. 3 for different pHs

| pH | Slope (cm²-mol/at.-L) | Intercept (cm²/at.) |
|---|---|---|
| 3 | 6.06 E−8 | 0.0106 |
| 4.5 | 4.60 E−10 | 0.0124 |
| 5.6 | 2.87 E−10 | 0.00854 |
| 10 | 4.80 E−8 | 0.00954 |

TABLE 2

Comparison of chemistry for SC1 with different mixing ratios, where mixture is the ratio of $[NH_3]:[H_2O_2]:[H_2O]$. /$NH_4Cl$ indicates that $NH_4Cl$ is added to compensate for low $[NH_4+]$ in a dilute SC1 recipe. [Total N] represents all sources of N ($[NH_4Cl]_0$ and $[NH_3]_0$).
Concentrations are in mol/l

| Mixture | 1:1:5 | 1:1:30 | 1:1:30/$NH_4Cl$ | 1:1:30 | 1:1:98/$NH_4Cl$ |
|---|---|---|---|---|---|
| $[NH_4Cl]_0$ | 0 | 0 | 6.19E−02 | 0 | 7.37E−02 |
| $[H_2O_2]_0$ | 1.41 | 0.309 | 0.309 | 9.88E−02 | 9.88E−02 |
| $[NH_3]_0$ | 1.91 | 0.419 | 0.419 | 0.134 | 0.134 |
| pH | 10.597 | 10.593 | 10.598 | 10.583 | 10.583 |
| $[Cl^-]$ | 0.00E+00 | 0.00E+00 | 6.19E−02 | 0.00E+00 | 7.37E−02 |
| $[H^+]$ | 2.53E−11 | 2.56E−11 | 2.55E−11 | 2.61E−11 | 2.61E−11 |
| $[OH^-]$ | 3.95E−04 | 3.91E−04 | 3.92E−04 | 3.83E−04 | 3.83E−04 |
| $[HO_2^-]$ | 7.90E−02 | 1.71E−02 | 1.71E−02 | 5.36E−03 | 5.36E−03 |
| $[NH_4^+]$ | 7.94E−02 | 1.75E−02 | 7.94E−02 | 5.74E−03 | 7.94E−02 |
| $[HN_3^+]$ | 1.83 | 0.401 | 1.82 | 0.129 | 1.78 |
| Total N | 1.91 | 0.418 | 1.84 | 0.134 | 1.78 |

What is claimed is:

1. A method for reducing the metal contamination on a surface of a semiconductor substrate comprising the step of submitting said substrate to a wet cleaning and/or rinsing process in a solution capable of oxidising said surface,
    said solution having a pH value larger than 5, and
    said solution containing a substance, at least about 6% of the substance dissociating and ionising in said solution thereby creating an amount of ions of at least one species in said solution, at least one of the ion species being such that the ions of the species binding to the oxidised surface in such a way that said amount of ions substantially reduces the amount of metal ions bound to an oxidised surface,
    wherein said solution comprises a mixture of ammonia, hydrogen peroxide and an alcohol, the alcohol selected from the group consisting of isopropanol, ethanol, and mixtures of ethanol and isopropanol.

2. The method as recited in claim 1, wherein the step of submitting said substrate to a wet cleaning and/or rinsing process in a solution capable of oxidising said surface includes the steps of:
    preparing said solution capable of chemically oxidising said surface and containing said substance; and thereafter
    immersing said substrate in said solution while maintaining processing conditions such that said substance is substantially reducing metal ions of binding to the oxidised surface.

3. The method as recited in claim 1, wherein the step of submitting said substrate to a wet cleaning and/or rinsing process in a solution capable of oxidising said surface includes the steps of:
    exposing said surface to an aqueous solution containing an oxidising agent and a base agent while maintaining processing conditions such that a chemical oxide is formed on said surface; and
    adding to said solution said substance capable of binding to the oxidised surface while maintaining processing conditions such that said substance is substantially reducing the amount of metal ions bound to the oxidised surface.

4. The method as recited in claim 1, wherein said ions are selected from the group consisting of a plurality of $NH_4^+$ ions and derivatives.

5. The method according to claim 1, wherein said semiconductor substrate is one of a batch of wafers being simultaneously processed in a single tank, tanks, or wet bench.

6. The method according to claim 1, wherein said semiconductor substrate is a single wafer in a single wafer cleaning tool.

7. The method according to claim 1, wherein said step of submitting said substrate includes the step of cleaning and/or etching one single surface or a double-sided surface of a semiconductor substrate.

* * * * *

UNITED STATES PATENT AND TRADEMARK OFFICE
CERTIFICATE OF CORRECTION

PATENT NO. : 6,592,676 B1 Page 1 of 1
DATED : July 15, 2003
INVENTOR(S) : Mertens et al.

It is certified that error appears in the above-identified patent and that said Letters Patent is hereby corrected as shown below:

<u>Column 12,</u>
Line 33, please correct that line to read:
-- ... being such that the ions of the species are binding to the ... --

Signed and Sealed this

Seventh Day of October, 2003

JAMES E. ROGAN
*Director of the United States Patent and Trademark Office*